(12) United States Patent
Lumpkin et al.

(10) Patent No.: US 7,308,393 B2
(45) Date of Patent: Dec. 11, 2007

(54) HARDWARE AND SOFTWARE CO-SIMULATION USING ESTIMATED ADJUSTABLE TIMING ANNOTATIONS

(75) Inventors: Everett R. Lumpkin, Galveston, IN (US); James A. Costa, Jr., Carmel, IN (US)

(73) Assignee: Delphi Technologies, Inc., Troy, MI (US)

( * ) Notice: Subject to any disclaimer, the term of this patent is extended or adjusted under 35 U.S.C. 154(b) by 615 days.

(21) Appl. No.: 10/420,376

(22) Filed: Apr. 22, 2003

(65) Prior Publication Data
US 2004/0215438 A1 Oct. 28, 2004

(51) Int. Cl.
*G06F 17/50* (2006.01)
(52) U.S. Cl. ........................................... 703/13
(58) Field of Classification Search ............... 703/13
See application file for complete search history.

(56) References Cited

U.S. PATENT DOCUMENTS

| | | | |
|---|---|---|---|
| 5,768,567 A | * | 6/1998 | Klein et al. ............... 703/13 |
| 5,946,472 A | * | 8/1999 | Graves et al. ............... 703/6 |
| 6,230,114 B1 | * | 5/2001 | Hellestrand et al. ......... 703/13 |
| 6,263,302 B1 | * | 7/2001 | Hellestrand et al. ......... 703/17 |
| 6,591,403 B1 | * | 7/2003 | Bass et al. ................... 716/5 |

FOREIGN PATENT DOCUMENTS

WO   WO 95/26000   * 3/1995

* cited by examiner

*Primary Examiner*—Paul Rodriguez
*Assistant Examiner*—Juan Carlos Ochoa
(74) *Attorney, Agent, or Firm*—Jimmy L. Funke

(57) ABSTRACT

A system and method for co-simulation of hardware and software includes determining hardware executable times, associated with each of a plurality of functions included within an application code. Estimated timing annotations, which correspond to the determined hardware executable times, are then inserted into each of the functions. The application code is compiled for simulation and the compiled application code is then executed on a host computer system. Adjustments may be made to the estimated timing annotations to evaluate potential architecture changes in either target hardware or software algorithms.

15 Claims, 3 Drawing Sheets

HARDWARE AND SOFTWARE CO-SIMULATION USING ESTIMATED ADJUSTABLE TIMING ANNOTATIONS

TECHNICAL FIELD

The present invention is generally directed to hardware and software co-simulation and, more specifically, hardware and software co-simulation using estimated adjustable timing annotations.

BACKGROUND OF THE INVENTION

In general, hardware and software co-simulation is defined as the ability to execute target microprocessor software within a simulated hardware environment for the purpose of analyzing, debugging and implementing the hardware and the software. In general, hardware and software co-simulation reduces a product's time-to-market, reduces the cost of the product (as co-simulation can eliminate multiple manufacturing builds) and allows software development prior to hardware availability. Currently, hardware and software co-simulations are accomplished through the use of functional models, timed functional simulation models, instruction-set simulation models and/or cycle accurate simulation models. When functional models are utilized to co-simulate hardware and software, the hardware and software are typically described in a high-level language, e.g., C, or with visual tools that execute on a general purpose computing platform. In general, functional models contain little or no timing information associated with the hardware and/or software execution.

With timed functional simulation models, the hardware executes on a scheduled interval, typically with respect to a clock, and the software may be synchronized with the hardware model at discrete time intervals. In general, the application software for the timed functional simulation model executes directly on a host computer system. The timed functional model has the advantage of fast simulation and less computations, but with an overall reduced fidelity and accuracy of the hardware/software simulation. In the instruction set simulation model, the application software is cross-compiled to a target processor instruction set, which is emulated on the host computer system, which acts as an instruction set simulator. In this manner, the instruction set simulator executes in synchronization, on instruction boundaries, with the hardware model.

In the cycle accurate simulation model, the application software is cross-compiled to a target processor instruction set and the instructions are executed on a cycle-by-cycle basis in synchronization with a scheduled hardware model. The cycle accurate simulation model and the instruction set simulation model are often referred to as co-verification models.

A prior technique for implementing a timed functional simulation model, which is described in U.S. Pat. No. 6,230,114, includes an analysis step that adds timing information to the application software to achieve a relatively high fidelity model. In this timed functional simulation model, synchronization points are inserted at each linear block of code. These synchronization points account for target processor instruction timing and pipeline effects and provide a highly accurate simulation model, whose accuracy approaches that of the final system, without performing continual context switching. However, this timed functional simulation model, in general, provides greater accuracy than required during software analysis, design and prototyping stages. The timed functional simulation model also does not allow for the adjustment of timing synchronization points to aid in exploration of target software execution times.

What is needed is a hardware and software co-simulation technique that facilitates exploration of different architectures and provides acceptable accuracy, while simultaneously reducing co-simulation time.

SUMMARY OF THE INVENTION

The present invention is directed to a system and method for co-simulation of hardware and software. Initially, hardware executable times associated with each of a plurality of functions, included within an application code, are determined. Then, estimated timing annotations, which correspond to the determined hardware executable times for one of each of the plurality of functions, are inserted into each of the plurality of functions. Next, the application code is compiled for simulation and the compiled code is then executed on a host computer system.

In one embodiment, each of the estimated timing annotations includes a minimum and maximum number of cycles for executing an associated one of the functions. In this manner, the estimated timing annotations can be adjusted during simulation to evaluate different target processors and architectural choices.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENT(S)

According to an embodiment of the present invention, a technique is described that improves upon current timed functional simulation models. It should be appreciated, however, that the advantages provided by the present invention are not limited to the timed functional simulation model. As previously mentioned, in general, timed functional simulation models offer accuracy near that of a final system. Typically, timed functional simulations run at about forty percent of the speed of an associated host computer system, while instruction set simulation and cycle accurate simulation models are often limited to speeds less than one percent of the speed of an associated host computer system.

Figure 1:
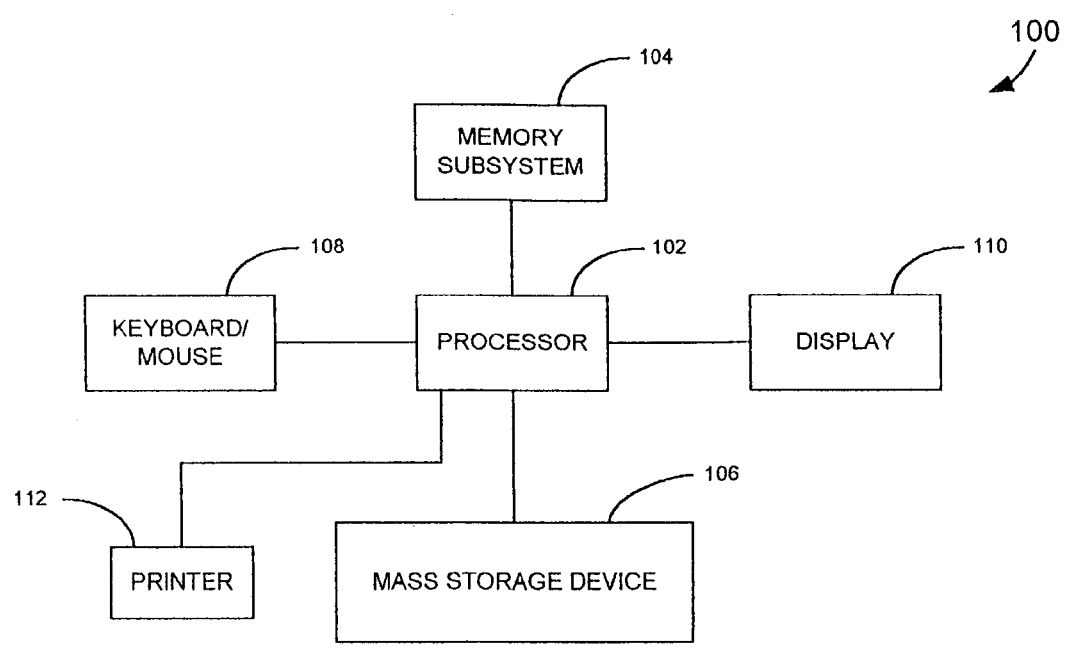
FIG. 1 is an electrical block diagram of an exemplary host computer system for co-simulating execution of application code for a target processor and associated hardware peripherals.

With reference to FIG. 1, an exemplary host computer system 100, for co-simulating execution of application code for a target processor and peripherals of the target processor, includes a host processor 102, which is coupled to a printer 112, a mass storage device 106, a keyboard/mouse 108, a memory subsystem 104 and a display 110. It should be appreciated that the computer system 100 may take various forms, e.g., a workstation or a personal computer (PC). The co-simulation technique, described herein, provides a level of modeling that offers a reasonable tradeoff between simulation speed and accuracy for use in hardware/software partitioning studies, as well as in software development.

In general, the co-simulation technique inserts fewer synchronization points than prior timed functional simulation models. These synchronization points are, generally, estimates of the software execution time associated with a specific target processor. The present invention then allows for adjustment of these estimates dynamically, during timed functional simulation, in order to allow for full analysis of the hardware and software designs, as well as the interactions between the hardware and software.

Implementing the co-simulation techniques, described herein, allow a designer to explore different architectures with adequate simulation speed and accuracy. Thus, instead of inserting synchronization points for each linear block of a code, the co-simulation technique performs analysis on entire functions of the application code. In general, the goal is to obtain an arbitrary timing accuracy of, for example, +/− twenty percent of actual hardware execution times. Such abstraction is generally necessary to increase the simulation speed and to lower the computational requirements of computing the synchronization points.

The inserted synchronization points have only a minor affect on the system software execution and are generally referred to herein as estimated timing annotations. The estimated timing annotations describe the minimum and maximum number of cycles for executing the function (which may infrequently be a linear block of code). The estimated timing annotations only affect execution when the code is compiled for simulation, as they are removed (via conditional code macros) when the code is cross-compiled for a target processor. During simulation, the estimated timing annotations temporarily halt the application software execution and allow the hardware simulation to execute the specified number of cycles. In this manner, the hardware simulation may be brought into synchronization with the software execution and the hardware essentially catches up to the estimated software execution time. Any pending interrupts generated by the hardware simulation may then cause execution of an appropriate target application code interrupt handling routine, prior to resuming the original application software execution.

During simulation, the user of the system may adjust the synchronization of the hardware and application software by specifying a ratio of execution cycles to the estimated timing annotations. Thus, a designer has a wide variety of options, such as using a maximum estimated execution time, a minimum estimated execution time, a percentage between the minimum and maximum execution times or even a percentage that exceeds the maximum execution time. In this manner, a user may evaluate the robustness of the software design when executing on a selected hardware architecture. Further, because the software design is at a high level of abstraction, the user has the ability to explore alternative hardware and software designs.

As previously mentioned, the estimated timing annotations are typically added near the last execution line of each function. The estimated timing annotations may be based upon the users domain knowledge of the function, or preferably by static analysis of the cross-compiled code. The source code is cross-compiled for the target processor and cycles are counted to determine a minimum and maximum execution pass through the function. For example, an internally developed program available from Delphi (timstk.exe) automates the cycle counting process for certain target processors. As previously mentioned, the timing annotations are added through a line of code, such as a Simulate_HW_Cycles(min, max) function, where 'min' is the minimum cycles to execute the region of code and 'max' is the maximum cycles to execute the region of code.

Set forth below is an exemplary application code function, i.e., bool IO_Serial EEPROM_Is_Busy(void), which shows an appropriate use of the Simulate_HW_Cycles function.

```
bool IO_Serial_EEPROM_Is_Busy(void)
{
    interrupt_state_t        interrupt_state;
    interrupt_state = Get_Interrupt_State( );
    Disable_Interrupts( );         /* INTERRUPTS DISABLED */
    /* Inquire the external device status when we think it is busy from
     * a previous write operation.
     */
    if (in_use & SERIAL_EE_BUSY)
    {
        /* Select and enable the EEPROM to read the status register */
        HW_Select_And_Write_SPI(HW_SERIAL_EE_ID,
        READ_STATUS_REG_COMMAND);
        /* Read the status */
        (void)HW_Read_And_Write_SPI(INVALID_COMMAND);
        /* If device "not ready" flag is clear, then operation
        is complete */
        if (!(DEVICE_NOT_READY & HW_Read_SPI( )))
        {
            in_use &= ~SERIAL_EE_BUSY;
            /* Read modify write */
        }
        HW_Deselect_SPI(HW_SERIAL_EE_ID);
        Simulate_HW_Cycles(34, 43);
    }
    Set_Interrupt_State(interrupt_state); /* INTERRUPT STATE
    RESTORED */
    Simulate_HW_Cycles(19, 62-43);
    return ((in_use & SERIAL_EE_BUSY));
}
```

Occasionally, it may be necessary to add timing annotations within loops and lengthy conditional branches. To achieve an overall arbitrary accuracy of, for example, +/− twenty percent, one checks each annotation to determine if the minimum is greater than eighty percent of the maximum. In the above example, the entire function requires a minimum of 19 cycles and a maximum of 62 cycles. While this annotation can be used, it does not meet the desired simulation accuracy of +/− twenty percent. To increase the simulation accuracy, a second annotation may be added inside the major "if" statement to reflect the timing of that branch of code, i.e., 34 to 43 cycles. Since the 62 cycles includes the maximum path of 43 cycles, the parameter for the last Simulate_HW_Cycles function is modified to reflect the second added annotation, i.e., 62 minus 43.

It should be appreciated that static analysis will not typically enable a user to determine the number of times that a loop is executed. Thus, an annotation may be added within a loop body to estimate the execution time for the loop body. Other control statements of the source language, i.e., switch statements or else statements, may optionally include timing annotation statements within their respective branches, as well. Timing annotations may be measured using static timing analysis from cross-compiled code or they may be estimated by human inspection.

Figure 2A:
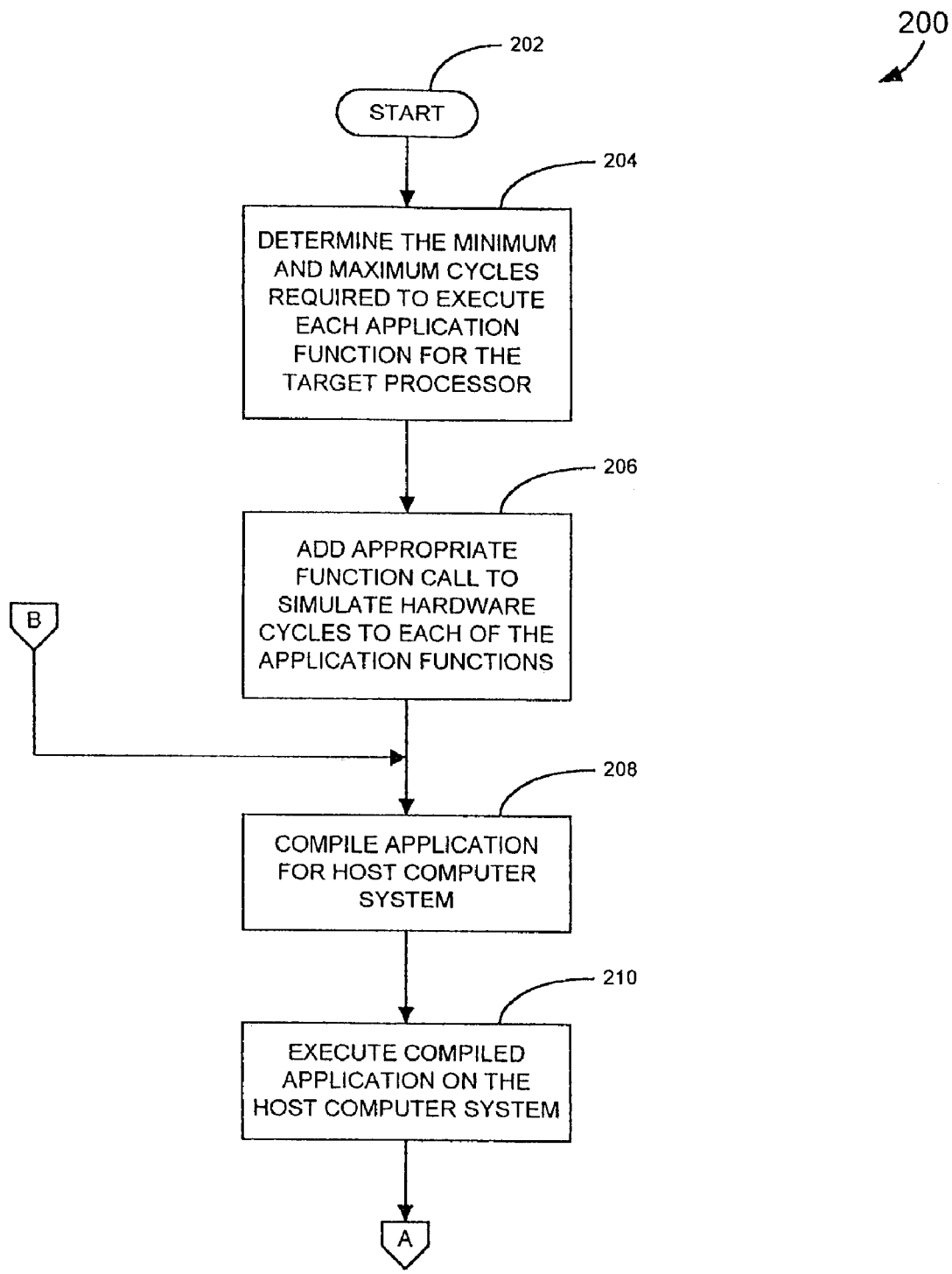
FIGS. 2A-2B depict a flow chart of an exemplary process for co-simulating hardware and software.
Figure 2B:
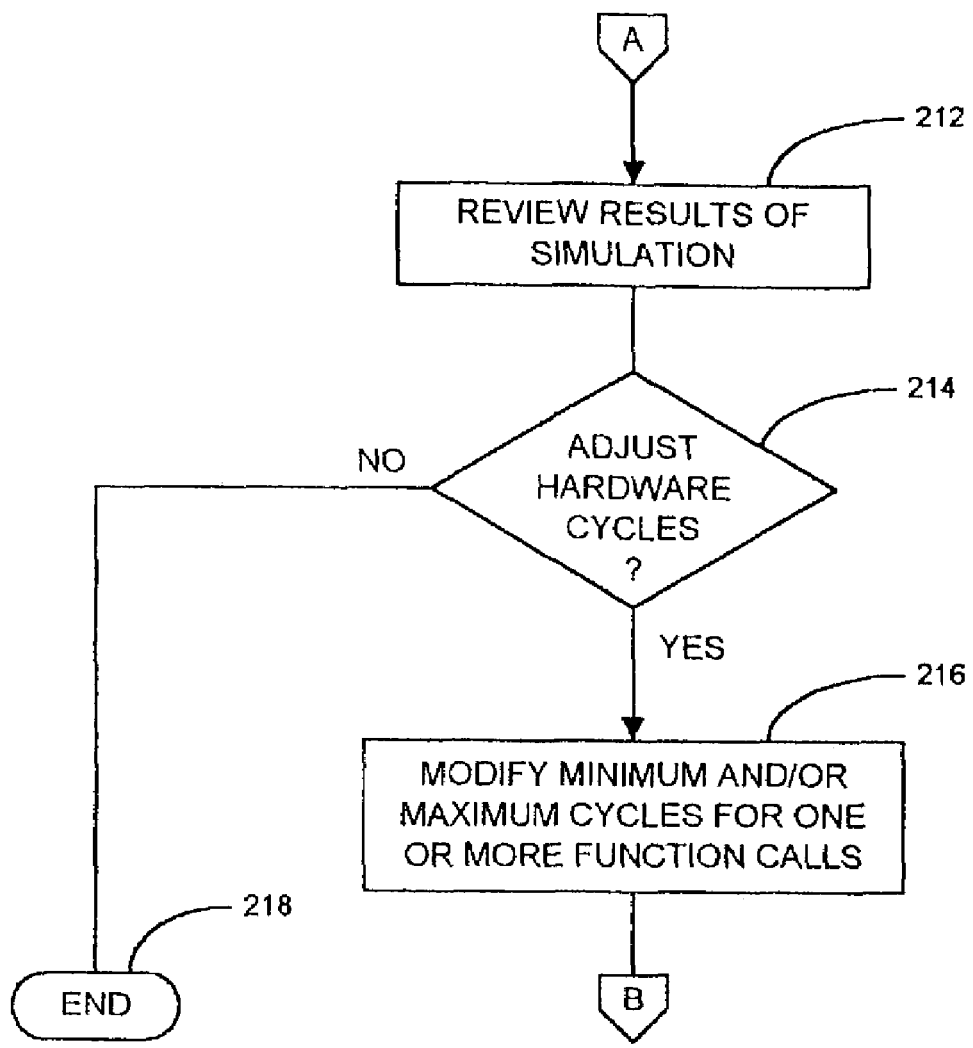

FIGS. 2A-2B depict a flow chart of an exemplary process 200 for co-simulating hardware and software. In step 202, the process 200 is initiated at which point control passes to step 204, where a designer or an automated routine, i.e., a script, determines the minimum and maximum cycles required to execute each application function for a target processor. Next, in step 206, the designer or script adds appropriate function calls to each of the application functions to simulate the hardware cycles associated with the target processor. Then, in step 208, the application is compiled for the host computer system 100. Next, in step 210, a timed functional simulation of the system is performed by executing the compiled application on the host computer system 100.

Then, in step 212, the designer may review the results of the simulation, e.g., via the display 110, and may print the simulation results on the printer 112. Next, in decision step 214, the designer determines if the system simulation performs as expected and may optimize the application software to use less hardware cycles and/or reconfigure the simulation to analyze a different target architecture that uses more or less hardware cycles. Thus, when control passes to step 216, the designer modifies the minimum and/or the maximum number of cycles for one or more function calls, at which point the application is re-compiled in step 208. If the designer does not desire to manipulate the hardware cycles in step 214, control passes to step 218 where the process 200 terminates.

Set forth below is a hardware simulator example that illustrates the use of the variable "Percent_Thruput," which may be used to adjust software and hardware synchronization. In the example set forth below, the function sc_start( ) is a call to a hardware simulator to cause execution of the hardware simulation for a specified amount of time.

```
int Percent_Thruput = 100;
void Simulate_HW_Cycles(unsigned int min_cycles, unsigned int max_cycles)
{
    /* Execute the hardware to catch up with the SW elapsed execution */
    /* 8 MHz (125 ns period) HC08 clock assumed */
    sc_start(min_cycles + (max_cycles-min_cycles) *
    Percent_thruput/100.0 * 125.0, SC_NS);
        if(interrupt_may_be_pending)
        {
           Evaluate_Interrupts( );
        }
} /* Simulate_HW_Cycles( ) */
```

The adjustable annotations may also be applied to instruction set simulation or cycle accurate simulation as well. For these types of simulations, the execution time of the instruction or hardware cycle predetermines the software execution time. Accumulated together, the aggregate instructions or cycles predetermine the software execution time of the plurality of functions. The simulation is adjusted to modify the hardware and software synchronization with a "Percent_thruput" control that allows the designer to observe the system behavior for a range of target processor capabilities.

Accordingly, techniques have been described herein which improve upon prior co-simulation models by allowing a user to couple an accurate but fast hardware simulation to estimates of the software application execution times. The estimates may be based upon prior knowledge of the system, measured execution times of cross-compiled code, or actual simulation times of cross-compiled code. Utilizing the co-simulation techniques described herein, a user may explore the hardware and software tradeoffs to achieve an optimum system/subsystem design. This may be achieved by adjusting the annotations, during the timed functional simulation for the plurality of functions. The adjustments are made to evaluate potential architecture changes in either target hardware or software algorithms. Thus, the software and hardware can be fully tested in a virtual environment prior to committing to a specific hardware platform.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the Doctrine of Equivalents.

The invention claimed is:

1. A method for co-simulation of hardware and software, comprising the steps of:
   determining hardware executable times for each of a plurality of functions included within an application code;
   inserting estimated timing annotations into each of the plurality of functions, wherein each of the estimated timing annotations corresponds to the determined hardware executable time for one of each of the plurality of functions, and include a minimum and maximum number of cycles for executing an associated one of the functions;
   compiling the application code for simulation;
   executing the compiled application code on a host computer system; and
   adjusting the estimated timing annotations during simulation.

2. The method of claim 1, wherein the estimated timing annotations are added immediately preceding a last execution line of each of the functions.

3. The method of claim 1, further including the step of re-compiling the application code for purposes other than simulation, wherein the estimated timing annotations only affect execution when the application code is compiled for simulation.

4. The method of claim 1, further comprising the step of cross-compiling the application code for a target processor, wherein the estimated timing annotations are removed when the application code is cross-compiled.

5. The method of claim 1, wherein the estimated timing annotations are measured using static timing analysis from a cross-compiled version of the application code.

6. A method for co-simulation of hardware and software, comprising the steps of:
   determining hardware executable times associated with each of a plurality of functions included within an application code;
   inserting estimated timing annotations into each of the plurality of functions, wherein each of the estimated timing annotations corresponds to the determined hardware executable time for one of each of the plurality of functions, and wherein each of the estimated timing annotations includes a minimum and maximum number of cycles for executing an associated one of the functions;
   compiling the application code for simulation; and
   executing the compiled application code on a host computer system.

7. The method of claim 6, wherein the estimated timing annotations are added immediately preceding a last execution line of each of the functions.

8. The method of claim 6, further including the step of re-compiling the application code for purposes other than simulation, wherein the estimated timing annotations only affect execution when the application code is compiled for simulation.

9. The method of claim 6, further comprising the step of cross-compiling the application code for a target processor, wherein the estimated timing annotations are removed when the application code is cross-compiled.

10. The method of claim 6, wherein the estimated timing annotations are measured using static timing analysis from a cross-compiled version of the application code.

11. A system for co-simulation of hardware and software, comprising:
   a host computer system including a host processor and a host memory subsystem; and
   an application code stored within the host memory subsystem, wherein the application code includes a plurality of estimated timing annotations based on determined hardware executable times associated with each of a plurality of functions included within the application code, and wherein the application code is compiled for execution on the host computer system, and wherein the estimated timing annotations are adjustable during simulation, and include a minimum and maximum number of cycles for executing an associated one of the functions.

12. The system of claim 11, wherein the estimated timing annotations are added immediately preceding a last execution line of each of the functions.

13. The system of claim 11, wherein the estimated timing annotations only affect execution when the application code is compiled for simulation.

14. The system of claim 11, wherein when the application code is cross-compiled for a target processor, the estimated timing annotations are removed from the application code.

15. The system of claim 11, wherein the estimated timing annotations are measured using static timing analysis from a cross-compiled version of the application code.

* * * * *